(12) United States Patent
Powell et al.

(10) Patent No.: US 7,294,324 B2
(45) Date of Patent: Nov. 13, 2007

(54) LOW BASAL PLANE DISLOCATION BULK GROWN SIC WAFERS

(75) Inventors: Adrian Powell, Cary, NC (US); Mark Brady, Carrboro, NC (US); Valeri F. Tsvetkov, Durham, NC (US)

(73) Assignee: Cree, Inc., Durham, NC (US)

( * ) Notice: Subject to any disclaimer, the term of this patent is extended or adjusted under 35 U.S.C. 154(b) by 281 days.

(21) Appl. No.: 11/147,645

(22) Filed: Jun. 8, 2005

(65) Prior Publication Data

US 2006/0075958 A1    Apr. 13, 2006

Related U.S. Application Data

(60) Provisional application No. 60/522,366, filed on Sep. 21, 2004.

(51) Int. Cl.
*C01B 33/36* (2006.01)

(52) U.S. Cl. .................. 423/328.2; 423/324; 423/345; 423/348; 423/349

(58) Field of Classification Search ........... 423/324, 423/328.2, 345, 348
See application file for complete search history.

(56) References Cited

U.S. PATENT DOCUMENTS

| | | | |
|---|---|---|---|
| 2,938,136 A | 5/1960 | Fischer | |
| 4,865,685 A | 9/1989 | Palmour | |
| 4,866,005 A | 9/1989 | Davis et al. | |
| 5,006,914 A | 4/1991 | Beetz, Jr. | |
| 5,030,583 A | 7/1991 | Beetz, Jr. | |
| 5,119,540 A | 6/1992 | Kong et al. | |
| 5,151,384 A | 9/1992 | Williams | |
| 5,210,051 A | 5/1993 | Carter, Jr. | |
| 5,311,055 A | 5/1994 | Goodman et al. | |
| 5,373,171 A | 12/1994 | Imai et al. | |
| 5,382,822 A | 1/1995 | Stein | |
| RE34,861 E | 2/1995 | Davis et al. | |
| 5,393,993 A | 2/1995 | Edmond et al. | |
| 5,422,901 A | 6/1995 | Lebby et al. | |
| 5,523,589 A | 6/1996 | Edmond et al. | |
| 5,611,955 A | 3/1997 | Barrett et al. | |
| 5,661,312 A | 8/1997 | Weitzel et al. | |

(Continued)

FOREIGN PATENT DOCUMENTS

EP    0 561 462 A2    9/1993

(Continued)

OTHER PUBLICATIONS

Muller, S.G. et al, "Progress in the industrial production of SiC substrates for semiconductor devices," Materials Science and Engineering B, Elsevier Sequoia, Lausanne, CH, vol. 80, No. 1-3, Mar 3, 2001, pp. 327-331.

(Continued)

*Primary Examiner*—Felisa Hiteshew
(74) *Attorney, Agent, or Firm*—Summa, Allan & Additon, P.A.

(57) ABSTRACT

A high quality single crystal wafer of SiC is disclosed. The wafer has a diameter of at least about 3 inches (75 mm) and at least one continuous square inch (6.25 cm$^2$) of surface area that has a basal plane dislocation volume density of less than about 500 cm$^{-2}$ for a 4 degree off-axis wafer.

15 Claims, 3 Drawing Sheets

U.S. PATENT DOCUMENTS

| | | |
|---|---|---|
| 5,667,586 A | 9/1997 | Ek et al. |
| 5,709,745 A | 1/1998 | Larkin et al. |
| 5,718,760 A | 2/1998 | Carter et al. |
| 5,872,415 A | 2/1999 | Dreifus et al. |
| 5,964,944 A | 10/1999 | Sugiyama et al. |
| 6,025,289 A | 2/2000 | Carter, Jr. et al. |
| 6,113,451 A | 9/2000 | Hobart et al. |
| 6,150,239 A | 11/2000 | Goesele et al. |
| 6,156,581 A | 12/2000 | Vaudo et al. |
| 6,196,901 B1 | 3/2001 | Minami |
| 6,200,917 B1 | 3/2001 | Carter et al. |
| 6,201,342 B1 | 3/2001 | Hobart et al. |
| 6,218,680 B1 | 4/2001 | Carter, Jr. et al. |
| 6,316,793 B1 | 11/2001 | Sheppard et al. |
| 6,316,826 B1 | 11/2001 | Yamamoto et al. |
| 6,329,088 B1 | 12/2001 | Landini et al. |
| 6,396,080 B2 | 5/2002 | Carter, Jr. et al. |
| 6,396,864 B1 | 5/2002 | O'Brien et al. |
| 6,403,982 B2 | 6/2002 | Carter, Jr. et al. |
| 6,497,763 B2 | 12/2002 | Kub et al. |
| 6,497,764 B2 | 12/2002 | Kuhn et al. |
| 6,507,046 B2 | 1/2003 | Mueller |
| 6,533,874 B1 | 3/2003 | Vaudo et al. |
| 6,548,333 B2 | 4/2003 | Smith |
| 6,568,384 B1 | 5/2003 | Onizaki |
| 6,583,454 B2 | 6/2003 | Sheppard et al. |
| 6,586,781 B2 | 7/2003 | Wu et al. |
| 6,599,815 B1 | 7/2003 | Yang |
| 6,634,770 B2 | 10/2003 | Cao |
| 6,639,247 B2 | 10/2003 | Carter, Jr. et al. |
| 6,670,693 B1 | 12/2003 | Quick |
| 6,686,676 B2 | 2/2004 | McNulty et al. |
| 6,692,568 B2 | 2/2004 | Cuomo et al. |
| 6,706,114 B2 | 3/2004 | Mueller |
| 6,757,314 B2 | 6/2004 | Kneissl et al. |
| 6,814,801 B2 | 11/2004 | Jenny et al. |
| 6,849,874 B2 | 2/2005 | Sumakeris et al. |
| 2001/0017374 A1 | 8/2001 | Tsvetkov |
| 2002/0078881 A1 | 6/2002 | Cuomo et al. |
| 2002/0086534 A1 | 7/2002 | Cuomo et al. |
| 2002/0096104 A1 | 7/2002 | Yagi et al. |
| 2002/0117695 A1 | 8/2002 | Borges et al. |
| 2002/0123204 A1 | 9/2002 | Torvik |
| 2002/0167023 A1 | 11/2002 | Chavarkar et al. |
| 2002/0180351 A1 | 12/2002 | McNulty et al. |
| 2002/0182779 A1 | 12/2002 | Bewley et al. |
| 2003/0096507 A1 | 5/2003 | Baker et al. |
| 2003/0102482 A1 | 6/2003 | Saxler |
| 2003/0107045 A1 | 6/2003 | Eisert et al. |
| 2003/0127654 A1 | 7/2003 | Eisert et al. |
| 2003/0219959 A1 | 11/2003 | Ghyselen et al. |
| 2003/0233975 A1 | 12/2003 | Jenny et al. |
| 2004/0023468 A1 | 2/2004 | Ghyselen et al. |
| 2004/0051141 A1 | 3/2004 | Udrea |
| 2004/0201024 A1 | 10/2004 | Tsvetkov et al. |
| 2004/0206298 A1 | 10/2004 | Jenny et al. |
| 2005/0022724 A1 | 2/2005 | Malta et al. |
| 2005/0022727 A1 | 2/2005 | Fechko et al. |
| 2006/0011128 A1 | 1/2006 | Ellison et al. |
| 2006/0073707 A1 | 4/2006 | Powell et al. |

FOREIGN PATENT DOCUMENTS

| | | |
|---|---|---|
| GB | 772 691 A | 4/1957 |
| JP | 3295267 | 12/1991 |
| JP | 11233391 | 2/1998 |
| JP | 2002265296 | 9/2002 |
| JP | 2003037074 | 2/2003 |
| JP | 2004 099340 | 9/2005 |
| WO | WO 90/00817 A1 | 1/1990 |
| WO | WO 97/28297 A1 | 8/1997 |
| WO | WO 2006/041660 A2 | 4/2006 |

OTHER PUBLICATIONS

Treu et al, "Challenges and first results of SiC Schottky Diode Manufacturing Using a 3 Inch Technology," Materials Science Forum, vol. 457-460, 2004, pp. 981-984.

T. Furusho, S.K. Lilov, Ohshima, S. Nishino;Crystal growth of silicon carbide in hydrogen atmosphere by sublimation close space technique;Journal of Crystal Growth 237-239 (2002) 1235-1238 Elsevier Science B.V. Japan.

I.G.Ivanov, C Hallin, A.Henry, O.Kordina, E.Janzen; Nitrogen doping concentration as determined by photoluminescence in 4H-and 6H-SiC; J. Appl. Phys. Sep. 15, 1996 3504-3508 American Institute of Physics.

J.R. Jenny, St. G. Muller, A.Powell, V.F. Tsvetkov, H.McD. Hobgood, R.C. Glass, & C.H.Carter; High Purity Semi-Insulating 4H-SiC Grown by the Seeded Sublimation Method; Preprint 2001 Electronic Materials Conference-submitted to Journal of Electronic Materials, U.S.A.

W. L. Pribble, et al., Applications of SiC MESFETs and GaN HEMTs in Power Amplifier Design; 2002 IEEE MTT-S Digest, 30:1819-1822.

S. Elhamri et al., Persistent Photoconductivity in a High Mobility two Dimensional Electron Gas in an AlGaN/GaN Heterostructure; 2001 Mat. Res. Soc. Symp. Proc. vol. 639, G7.6.1-G7.6.6.

A. Saxler, et al., Electroluminescence of III-Nitride Double Heterostructure Light Emitting Diodes with Silicon and Magnesium Doped InGaN, Materials Science Forum vols. 258-263 1997, pp. 1229-1234.

D. K. Gaskill, Summary of the Workshop on Bonded and Compliant Substrates, MRS Internet Journal, Nitride Semiconductor Research, Mar. 4, 1998, 2 pages.

G. K. Celler et al., Frontiers of silicon-on-insulator, Journal of Applied Physics, vol. 93, No. 9, May 1, 2003 p. 4955.

H. Moriceau, et al., New Layer Transfers Obtained by the SmartCut Process, Journal of Electronic Materials, vol. 32, No. 8, 2003, pp. 829-835.

Kuhr et al.; "Hexagonal Voids and the Formation of Micropipes During SiC Sublimation Growth," J. Appl.Phys., vol. 89, No. 8, 2001, pp. 4625-4630.

Powell; "Growth of Low Micropipe Density SiC Wafers" Materials Science Forum, vol. 338-340, 2000, pp. 437-440.

Mueller; "Status of SiC Bulk Growth from an Industrial Point of View", Journal of Crystal Growth, vol. 211, No. 1, 2000, pp. 325-332.

Dmitriev et al.; "Large Area Silicon Carbide Devices Fabricated on SiC Wafers with Reduced Micropipe Density", Materials Science and Engineering, vol. B61-62, 1999, pp. 446-449.

Sanchez et al.; "Formation of Thermal Decomposition Cavities in Physical Vapor Transport of Silicon Carbide", vol. 29, No. 3, 2000, pp. 347-352.

Rabeck et al.; "Thermodynamic Considerations of the Role of Hydrogen in Sublimation Growth", Journal of the Electrochemical Society, vol. 144, 1997, pp. 1024-1027.

Lilov et al.; "Studies of Growth Processes in Silicon Carbide Epitaxial Layers from the Vapour Phase", Journal of Crystal Growth, vol. 32, 1976, pp. 170-178.

Bakin et al.; "State of the Art in Defect Control of Bulk SiC", 1998 High Temperature Electronic Materials, Devices and Sensors Conference, 1998.

Vetter et al.; "Harmonic Composition of Synchrotron White-beam X-ray Topographic Back-reflection Images of Basal-cut Silicon Carbide Single-Crystal Wafers", J. Appl. Cryst., vol. 31, 1998, pp. 820-822.

Everything Wafers: A Guide to Semiconductor Substrates, www.ece.byu.edu/cleanroom/everything_wafers.phtml?everything_wafers-see-all=true 2004.

LOW BASAL PLANE DISLOCATION BULK GROWN SIC WAFERS

This application claims benefit of 60/522,366 Sep. 21, 2004.

STATEMENT OF GOVERNMENT INTEREST

This invention was developed under Office of Naval Research/DARPA Contract No. N00014-02-C-0302. The government may have certain rights in this invention.

BACKGROUND OF THE INVENTION

The present invention relates to low defect silicon carbide wafers and their use as precursors for semiconductor purposes, and to seeded sublimation growth of large, high-quality silicon carbide single crystals.

The invention is also related to the following copending and commonly assigned U.S. applications Ser. No. 10/628,189 filed Jul. 28, 2003 for Growth of Ultra-High Purity Silicon Carbide Crystals in an Ambient Containing Hydrogen; Ser. No. 10/628,188 filed Jul. 28, 2003 for Reducing Nitrogen Content in Silicon Carbide Crystals by Sublimation Growth in a Hydrogen-Containing Ambient; Ser. No. 10/707,898 filed Jan. 22, 2004 for Silicon Carbide on Diamond Substrates and Related Devices and Methods; Ser. No. 60/522,326 filed Sep. 15, 2004 for Seed Preparation for the Growth of High Quality Large Size Silicon Carbide Crystals; Ser. No. 10/915,095 filed Aug. 10, 2004 for Seed and Seedholder Combinations for High Quality Growth of Large Silicon Carbide Single Crystals; and Ser. No. 10/876,963 filed Jun. 25, 2004 for One Hundred Millimeter High Purity Semi-Insulating Single Crystal Silicon Carbide Wafer. The contents of these applications are likewise incorporated entirely herein by reference.

Silicon carbide has found use as semiconductor material for various electronic devices and purposes in recent years. Silicon carbide is especially useful due to its physical strength and high resistance to chemical attack. Silicon carbide also has excellent electronic properties, including radiation hardness, high breakdown field, a relatively wide band gap, high saturated electron drift velocity, high-temperature operation, and absorption and emission of high-energy photons in the blue, violet, and ultraviolet regions of the spectrum.

Single crystal silicon carbide is often produced by a seeded sublimation growth process. In a typical silicon carbide growth technique, the seed crystal and a source powder are both placed in a reaction crucible which is heated to the sublimation temperature of the source and in a manner that produces a thermal gradient between the source and the marginally cooler seed crystal. The thermal gradient encourages vapor phase movement of the materials from the source to the seed followed by condensation upon the seed and the resulting bulk crystal growth. The method is also referred to as physical vapor transport (PVT).

In a typical silicon carbide growth technique, the crucible is made of graphite and is heated by induction or resistance, with the relevant coils and insulation being placed to establish and control the desired thermal gradient. The source powder is silicon carbide, as is the seed. The crucible is oriented vertically, with the source powder in the lower portions and the seed positioned at the top, typically on the seed holder; see U.S. Pat. No. 4,866,005 (reissued as No. Re34,861) the contents of which are incorporated entirely herein by reference. These sources are exemplary, rather than limiting, descriptions of modern seeded sublimation growth techniques.

Although the density of structural defects in silicon carbide bulk crystals has been continually reduced in recent years, relatively high defect concentrations still appear and have been found to be difficult to eliminate, e.g. Nakamura et al., "Ultrahigh quality silicon carbide single crystals," *Nature*, Vol. 430, Aug. 26, 2004, page 1009. When dislocations lying in the basal plane (c-plane) of the crystal exists on the surface of the seed crystal substrate, these dislocations may persist in the subsequent growth of the crystal. These defects can cause significant problems in limiting the performance characteristics of devices made on the substrates, or in some cases can preclude useful devices altogether.

Current seeded sublimation techniques for the production of large bulk single crystals of silicon carbide typically result in a higher than desired concentration of defects on the basal plane growing surface of the silicon carbide crystal. Higher concentrations of defects can cause significant problems in limiting the performance characteristics of devices made on the crystals, or substrates resulting from the crystals. For example, a typical micropipe defect density in the basal plane of some commercially available silicon carbide wafers can be on the order of 100 per square centimeter ($cm^{-2}$). A megawatt device formed in silicon carbide, however, requires a defect free area on the order of 0.4 $cm^{-2}$. Thus, obtaining large single crystals that can be used to fabricate large surface area devices for high-voltage, high current applications remain a worthwhile goal.

Although small samples of low-defect silicon carbide have been available, a broader commercial use of silicon carbide requires larger samples, and in particular, larger wafers. By way of comparison, 100 mm (4") silicon wafers have been commercially available since 1975 and 150 mm (6") silicon wafers became available in 1981. Gallium arsenide (GaAs) is also commercially available in both 4" (100 mm) and 6" (150 mm) wafers. Thus, the commercial availability of 50 mm (2") and 75 mm (3") SiC wafers lags behind these other materials and to some extent limits the adoption and use of SiC in a wider range of devices and applications.

The nature and description of specific defects is generally well understood in the crystal growth art. Micropipes are common defects that can be found in SiC and can develop or propagate during the seeded sublimation production of SiC crystals. Other defects that may be present in SiC crystals include threading, edge, and screwdislocations, along with hexagonal voids, stacking faults and basal plane dislocations. If these defects remain in the SiC crystal, then resulting devices grown on the crystal may incorporate these defects.

A micropipe is a hollow core super-screw dislocation with its Burgers vector typically lying along the c-axis. A number of causes have been proposed or identified for the generation of micropipes. These include excess materials such as silicon or carbon inclusions, extrinsic impurities such as metal deposits, boundary defects, and the movement or slippage of partial dislocations. See e.g. Powell et al., Growth of Low Micropipe Density SiC Wafers, Materials Science Forum, Vols. 338-340, pp 437-440 (2000).

Hexagonal voids are flat, hexagonal platelet-shaped cavities in the crystal that often have hollow tubes trailing beneath them. Some evidence shows that micropipes are associated with hexagonal voids. A relatively recent discussion of such defects (exemplary and not limiting) is set forth in Kuhr et al., Hexagonal Voids And The Formation Of Micropipes During SiC Sublimation Growth, Journal of Applied Physics, Volume 89, No. 8, page 4625 (April 2001).

Recent research indicates that problems in the bulk crystals produced in a seeded sublimation technique can originate with the seed itself and the manner in which it is physically handled; e.g., Sanchez et al Formation Of Thermal Decomposition Cavities In Physical Vapor Transport Of Silicon Carbide, Journal of Electronic Materials, Volume 29, No. 3, page 347 (2000). Sanchez uses the term "micropipe" to describe, "approximately cylindrical voids with diameters in the range of 0.1 µm to 5 µm that form at the core of superscrew dislocations aligned parallel or nearly parallel to the [0001] axis" Id. at 347. Sanchez refers to larger voids ("diameters from 5 µm to 100 µm") as, "thermal decomposition cavities," and opines that micropipes and thermal decomposition cavities arise from different causes. Id.

Accordingly, producing larger high quality bulk single crystals of silicon carbide with low basal plane defect levels in crystals formed in the seeded sublimation system remains a constant technical commercial goal.

Basal plane dislocations are typically positioned within a (0001) plane either intersecting a surface or creating a closed loop. For most applications the primary concern is the number of basal plane dislocations that will intersect the wafer surface and hence propagate into the subsequently deposited epitaxial layer. When the SiC wafer is to be used as a substrate for epitaxial growth, it is critical to consider the number of dislocations that intersect the wafer surface. This number is measured by conducting a defect etch of the wafer that will reveal pits at the dislocation locations. For this measurement the number of dislocations intersecting the surface will increase as the offcut ("off-axis") angle from the <0001> direction is increased. Most commercial SiC wafers are presently produced with an offcut angle of 4 degrees, however any other angle can be used from zero to 90 degrees. Counting the number of dislocations (observable as straight or curved lines) in a given representative area gives a representative basal plane defect density.

In the case where the substrate is used as an active device layer, the density of defects in the bulk material is also of concern and the most appropriate measurement is the total line length of basal plane dislocations in a given volume of material. This is measured by considering a small volume of material (such as that contained in a sample for X-ray topography) and measuring the total length of dislocations observed. This length is then divided by the volume of the sample to provide the total line length of basal plane dislocation per $cm^3$.

SUMMARY

In one aspect, the present invention is a high quality single crystal wafer of SiC having a diameter of at least about 3 inches (75 mm) and at least one continuous square inch (6.25 $cm^2$) of surface area having a basal plane dislocation density of less than about 200 $cm^{-2}$.

In another aspect, the invention is a SiC semiconductor precursor wafer having a diameter of at least about 3 inches (75 mm) and at least one continuous square inch (6.25 $cm^2$) of surface area having a basal plane dislocation density of less than about 100 $cm^{-2}$.

In another aspect, the invention is a method of using a high quality single crystal wafer of SiC having a diameter of at least about 3 inches (75 mm) and at least one continuous square inch (6.25 $cm^2$) of surface area having a basal plane dislocation density of less than about 100 $cm^{-2}$ in a seeded sublimation growth system.

In yet another aspect, the invention is a plurality of power devices built on a single crystal seed of SiC having a diameter of at least about 3 inches (75 mm) and at least one continuous square inch (6.25 $cm^2$) of surface area having a basal plane dislocation density of less than about 100 $cm^{-2}$.

DETAILED DESCRIPTION

Figure 1:
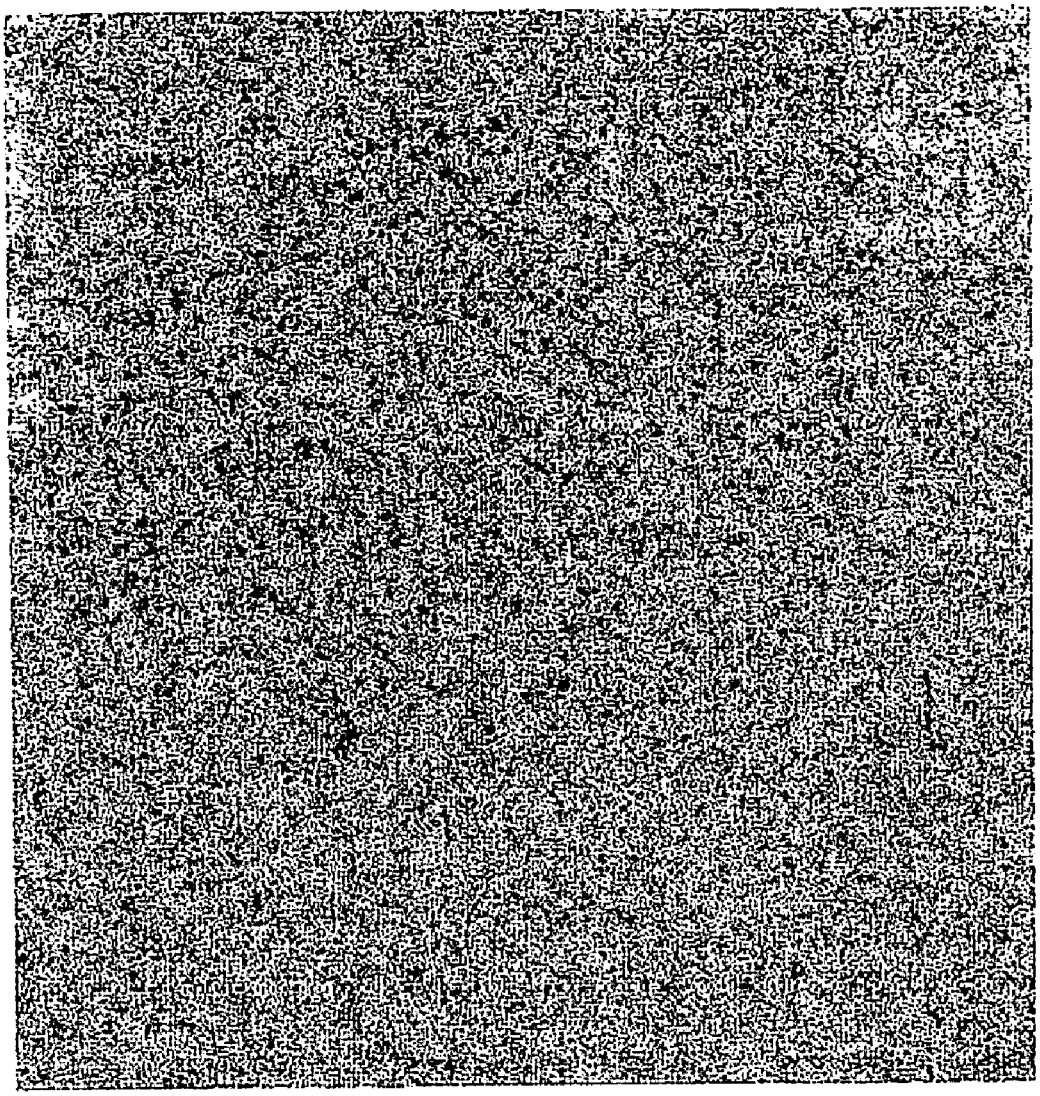
FIG. 1 is an x-ray transmission topograph of a 4 degree off SiC wafer in accordance with the present invention.

The present invention relates to high quality silicon carbide wafers. In particular, the present invention incorporates several techniques for improving the growth of such wafers using seeded sublimation.

In the following description basal plane dislocation densities will be specified as the area density for a 4 degree off-axis wafer. There is, however, an explicit assumption that a direct relationship exists between this area measurement and the total basal plane line length in the material.

In one aspect, the present invention is a high quality single crystal wafer of SiC having a diameter of at least about 3 inches (75 mm) and at least one continuous square inch (6.25 $cm^2$) of surface area having a basal plane dislocation density of less than about 500 $cm^{-2}$, more preferably less than about 75 $cm^{-2}$, and most preferably less than about 50 $cm^{-2}$. The polytype of the single crystal SiC is preferably 3C, 4H, 6H, 2H, or 15R.

In considering the proportional dimensions of the diameter and thickness of the seed crystal, whether expressed as a percentage, a fraction, or a ratio, it will be understood that in the context of the improvements provided by the invention, these proportions have their inventive meaning in the context of the larger-diameter seed crystals that are described herein.

Accordingly, in certain embodiments the invention is described and claimed herein in the relevant embodiments in a manner that includes the absolute dimensions of the crystal, usually in terms of a diameter, of which 2 inch (50 mm), 3 inch (75 mm), and 100 mm diameter single crystals are preferred. More precisely of course, one inch is equal to 25.4 mm, meaning that three inches are equal to 76.2 mm. As is sometimes common in the wafer art, however, terms such as "three inches" and "75 mm" are used interchangeably. Those of ordinary skill in the art will recognize this common practice, along with the substitution of "50 mm" for "two inches," "100 mm" for "four inches," etc. These substitutions are not intended to limit the conversion of English to metric units, but are, instead, intended to represent common usage in the art.

FIG. 1 is an X-ray Transmission Topograph of a SiC wafer formed in accordance with the present invention. The topograph is of a 0.5 cm×0.5 cm region of a wafer taken from a 3 inch (75 mm) diameter boule. The wafer has been thinned to approximately 80 μm to achieve better contrast in the topograph.

The 4 degree offcut sample shown in FIG. 1 includes 11 basal plane dislocations (observable as straight or curved lines) in a 0.5 cm by 0.5 cm area. Assuming that these all would intersect with the sample surface, provides a basal plane defect density of 44 cm$^{-2}$. In calculating volume density, these 11 basal plane dislocations have an average length of 0.05 cm, giving a total sample line length of 0.55 cm. The viewed area is 0.5 cm by 0.5 cm and the sample thickness is 0.008 cm giving a sample volume of 0.002 cm$^3$. Thus the total line length per cm$^{-3}$ for this sample is 275 cm/cm$^3$; i.e., 275 cm$^{-2}$.

In yet another aspect, the invention is a high quality semiconductor precursor wafer of silicon carbide having a 4H polytype, a diameter of at least about 3 inches (75 mm), and having at least one continuous square inch (6.25 cm$^2$) of surface area having between about 2,000 and 20,000 dislocations intersecting the surface of the wafer (for a 4 degree off-axis wafer).

Figure 2:
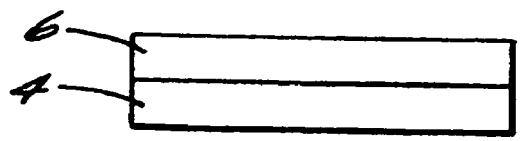
FIG. 2 is a schematic cross-sectional view of a semiconductor precursor wafer in accordance with the present invention.

In another aspect as schematically depicted in FIG. 2, the invention is a high quality silicon carbide semiconductor precursor wafer 4 having a 4H polytype, a diameter of at least about 3 inches (75 mm), and at least one continuous square inch (6.25 cm$^2$) of surface area having a basal plane dislocation density of less than about 500 cm$^{-2}$. The wafer additionally has at least one Group III-nitride layer 6 located on the surface. The Group III-nitride layer 6 is preferably one or more layer of GaN, AlGaN, AlN, AlInGaN, InN, AlInN, and combinations thereof.

The growth and electronic characteristics of Group III nitrides are generally well-understood in this art. Group III nitride layers on silicon carbide substrates are a basic feature of certain types of light emitting diodes (LEDs). Among other desirable factors, the atomic fraction of the Group III element (e.g. In$_x$Ga$_y$N$_{1-x-y}$) tailors the bandgap of the composition (within limits) to likewise tailor the resulting emission frequency and thus the color of the LED.

Figure 3:
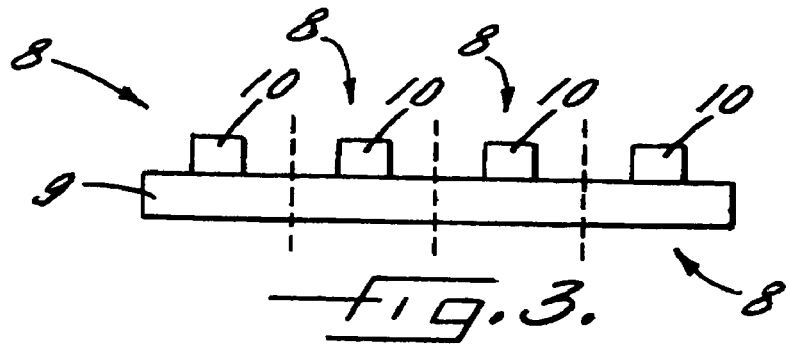
FIG. 3 is a schematic cross-sectional view of a plurality of semiconductor precursor devices in accordance with the present invention.

FIG. 3 is a schematic illustration of a plurality of silicon carbide semiconductor device precursors 8 on a SiC wafer 9 having a diameter of at least about 3 inches (75 mm) and at least one continuous square inch (6.25 cm$^2$) of surface area with a basal plane dislocation density of between about 50 and 500 cm$^{-2}$. The schematically-illustrated devices include a plurality of respective Group III-nitride epitaxial layers 10 on some portions of the wafer. Preferred Group III-nitride epitaxial layers are individually selected from GaN, AlGaN, AlN, AlInGaN, InN, and AlInN.

In another aspect, the invention is a method of producing a high quality bulk single crystal of silicon carbide in a seeded sublimation system. In this aspect, the invention includes growing a SiC boule having a diameter of at least about 3 inches (75 mm) and having at least one continuous square inch (6.25 cm$^2$) of surface area with a basal plane dislocation density of less than about 500 cm$^{-2}$, thereafter slicing the SiC boule, preferably mechanically, into wafers, wherein each wafer has a basal plane dislocation density of less than about 500 cm$^{-2}$ on at least one continuous square inch (6.25 cm$^2$) of the surface. The wafers are preferably about 0.5 mm thick.

It may be preferable to thin the SiC wafers to highlight defects for x-ray topography. A preferred thickness for counting purposes is about 80 μm. The thinning of the wafer is carried out in order to highlight the defects on the surface, and is unnecessary as a precursor step to seeded sublimation. Thus, sublimation growth is typically carried out on a polished seed that has not been thinned.

As is known in the art, the SiC boule is preferably grown in a seeded sublimation system. After the boule is sliced into wafers, the wafers may then, in turn, be used as the seed in a seeded sublimation growth of a single crystal of silicon carbide.

As noted in the background portion of the specification, the general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, the descriptions given herein are most appropriately given in a general and schematic sense with the recognition that those persons of skill in this art will be able to carry out the improvements of the invention based on the disclosures herein without undue experimentation.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Figure 4:
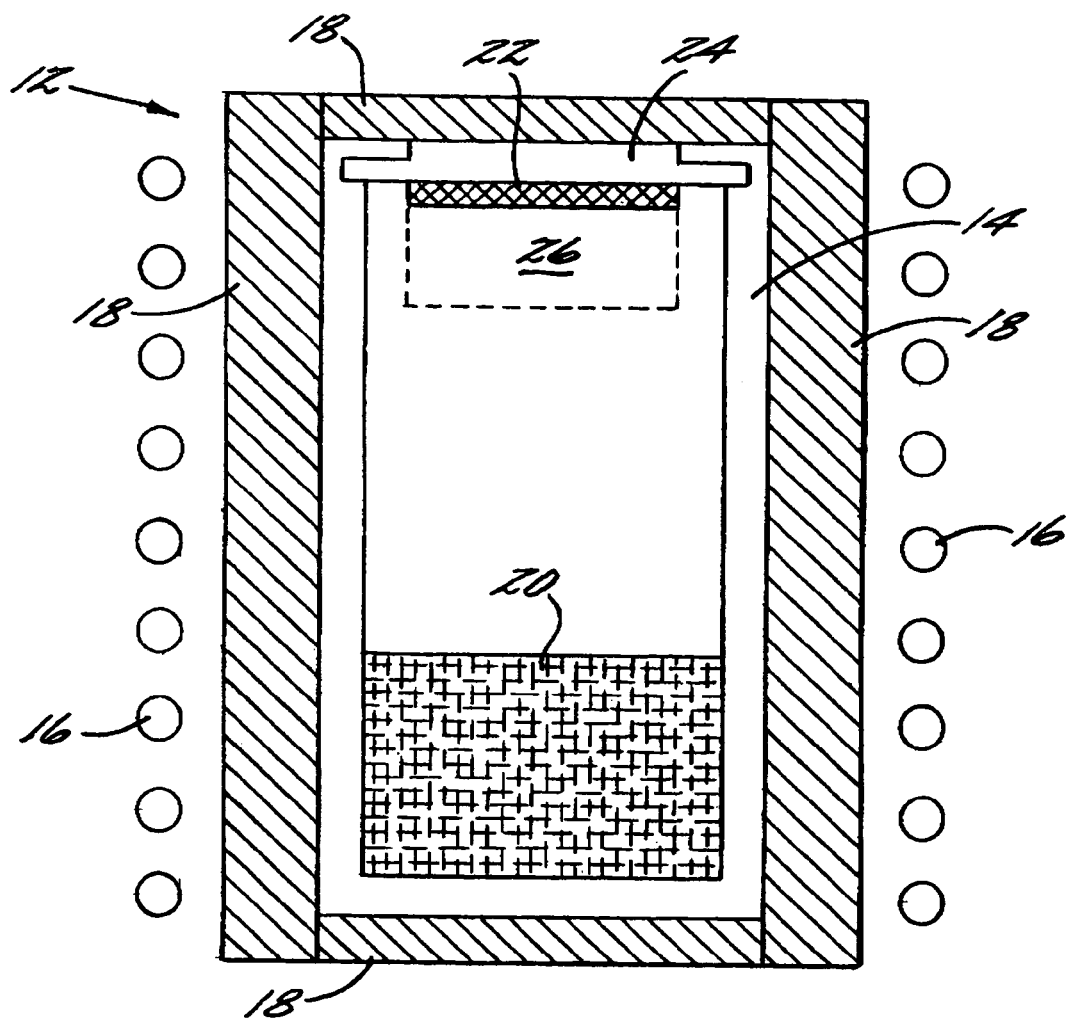
FIG. 4 is a schematic cross-sectional view of a seeded sublimation system in accordance with the present invention.

FIG. 4 is a cross sectional schematic diagram of a sublimation system for seeded sublimation growth of the type contemplated as useful in the present invention. The system is broadly designated at 12. As in most typical systems, the system 12 includes a graphite susceptor, or crucible, 14 and a plurality of induction coils 16 that heat the susceptor 14 when current is applied through the coils 16. Alternatively, some systems incorporate resistance heating. It will be understood by those familiar with these crystal growth techniques that the system can be further enclosed in some circumstances, e.g., in a water-cooled quartz vessel. Additionally, at least one gas inlet and outlet (not shown) in communication with the susceptor 14 are included in the seeded sublimation system 12. Such further enclosures are, however, less relevant to the invention and are omitted herein to help clarify the drawing and description. Additionally, those persons skilled in this art recognize that silicon carbide sublimation systems of the type described herein are available both commercially and as constructed in a custom fashion as may be necessary or appropriate. They accordingly can be selected or designed by those of ordinary skill in this art without undue experimentation.

The susceptor 14 is typically surrounded by insulation 18, several portions of which are illustrated in FIG. 4. Although FIG. 4 illustrates the insulation as being generally consistent in size and placement, it will be understood and is recognized by those of skill in the art that the placement and amount of the insulation 18 can be used to provide desired thermal gradients (both axially and radially) along the susceptor 14. Again, for purposes of simplification, these possible permutations are not illustrated herein.

For purposes of clarity, the singular term, "thermal gradient," will be used herein, but it will be understood by those of skill in this art that several gradients can desirably co-exist in the susceptor 14 and can be subcategorized as axial and radial gradients, or as a plurality of isotherms.

The susceptor 14 includes one or more portions for containing a silicon carbide powder source 20. Such a powder source 20 is most commonly—although not exclusively—used in seeded sublimation growth techniques for silicon carbide. FIG. 4 illustrates the powder source 20 as being contained in a lower portion of the susceptor 14 and this is one typical arrangement. As another familiar variation, some systems distribute the source powder in a vertical, cylindrical arrangement in which the source powder surrounds a larger portion of the interior of the susceptor 14 than does the arrangement illustrated in FIG. 4. The invention described herein can be appropriately carried out using both types of equipment.

A silicon carbide seed is designated at 22, and is typically placed in upper portions of the susceptor 14. The seed 22 is preferably a monocrystalline SiC seed having a diameter of at least about 3 inches (75 mm). A growing crystal 26 is deposited on the seed 22 during the seeded sublimation growth.

A seed holder 28 typically holds the seed 22 in place with the seed holder 28 being attached to the susceptor 14 in an appropriate fashion. This can include various arrangements known in the art. In the orientation illustrated in FIG. 4, the upper portions of the seed holder 28 are attached to the uppermost portions of the susceptor 14, preferably a graphite crucible, to hold the seed 22 in the desired position. The seed holder 28 is preferably a graphite seed holder.

In some embodiments, it may be preferred to include dopant atoms in the sublimation system 12. Introducing dopant gases to the seeded sublimation system 12 incorporates dopant atoms in a growing crystal. Dopants are selected for their acceptor or donor capabilities. In a given semiconductor, donor dopants produce n-type conductivity and acceptor dopants produce p-type conductivity. Preferred dopant atoms include n-type and p-type dopant atoms. Especially preferred n-type dopants include N, P, As, Sb, Bi, and mixtures thereof. Especially preferred p-type dopants include B, Al, Ga, In, Tl, and mixtures thereof.

In a typical sublimation growth technique, an electric current, having a frequency to which the susceptor 14 responds, is passed through the induction coils 16 to heat the graphite susceptor 14. The amount and placement of the insulation 18 are selected to create a thermal gradient between the powder source 20 and the growing crystal 26 when the susceptor 14 heats the powder source 20 to sublimation temperatures, which are typically above about 2000° C., preferably between about 2100° C. and about 2500° C. The thermal gradient is established to maintain the temperature of the seed 22 and thereafter a growing crystal near, but below, the temperature of the silicon carbide source to thereby thermodynamically encourage the vaporized species that are generated when silicon carbide sublimes (Si, $Si_2C$, and $SiC_2$) to condense first upon the seed crystal and thereafter upon the growing crystal; e.g., U.S. Pat. No. 4,866,005.

If the temperature gradients and other conditions (pressure, carrier gases, etc.) are properly maintained, the overall thermodynamics will encourage the vaporized species to condense first on the seed 22 and then on the growing crystal 26 in the same polytype as the seed 22.

After reaching the desired crystal size, growth is terminated by reducing the temperature of the system to below about 1900° C. and raising the pressure to above about 400 torr.

It may be further desirable to anneal the crystal after completion of the sublimation growth process. The crystal may be annealed at temperatures at or above the growth temperature for a period greater than about 30 minutes.

As generally noted in the Background, the performance properties of electronic devices will typically improve as the crystal quality of the various device portions improves. Thus, the reduced-defect characteristics of wafers of the present invention similarly provide improved devices. In particular, higher power higher current devices become increasingly available as the basal plane dislocation density on at least one continuous square inch (6.25 $cm^2$) of surface area drops to about 500 $cm^{-2}$ or below.

Thus, in another aspect, the invention is a plurality of field-effect transistors formed on a low-defect 3 inch (75 mm) silicon carbide wafer having at least one continuous square inch (6.25 $cm^2$) of surface area with a basal plane dislocation density of between about 50 and 500 $cm^{-2}$.

Figure 5:
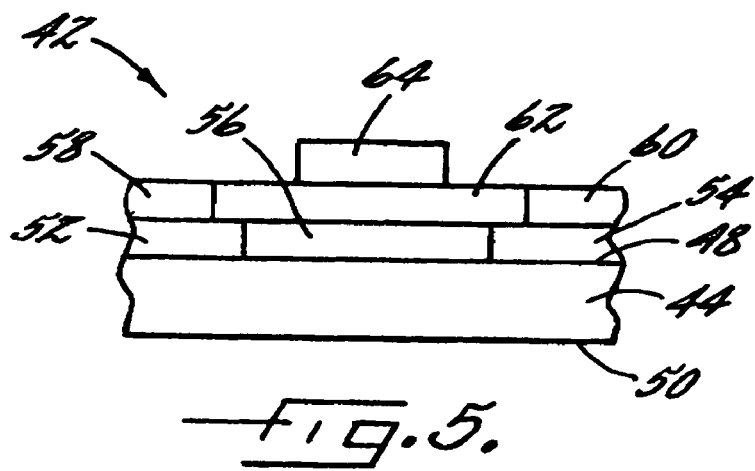
FIG. 5 is a schematic cross-sectional view of a metal oxide semiconductor field effect transistor in accordance with the present invention.

In another aspect and as schematically illustrated in FIG. 5, the invention is a plurality of metal oxide semiconductor field effect transistors (MOSFETs) 42 formed on a low defect 3 inch (75 mm) silicon carbide substrate 44 having at least one continuous square inch (6.25 $cm^2$) of surface area with a basal plane dislocation density of less than about 500 $cm^{-2}$, in some cases between about 50 and 500 $cm^{-2}$, and in some cases—to date predictive—less than 50 $cm^{-2}$. FIG. 5 illustrates a basic MOSFET structure. The bulk single crystal substrate 44 includes a respective first surface 48 and second surface 50 opposite one another. An epitaxial layer on the substrate has respective source 52, channel 56, and drain 54 portions with the channel 56 being controlled by the gate contact 64 through the oxide layer 62. Respective source and drain contacts 58, 60 are on the source and drain portions 52, 54. The structure and operation of MOSFETs, and of combinations and variations of MOSFETs, is well understood in this art and thus FIG. 5 and its description are exemplary rather than limiting of the claimed invention.

Figure 6:
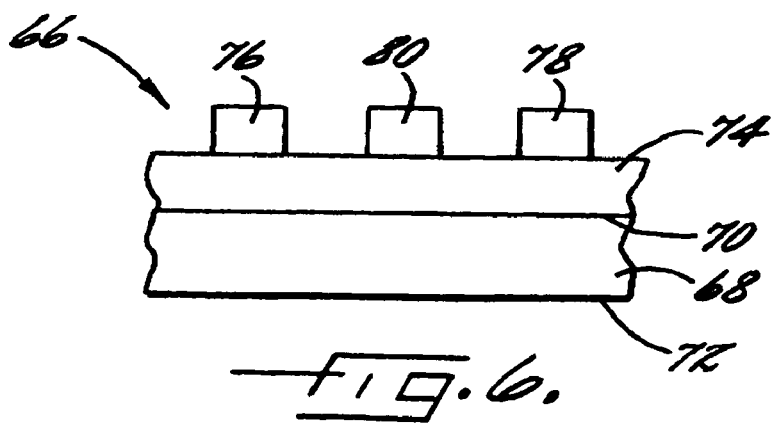
FIG. 6 is a schematic cross-sectional view of a metal semiconductor field effect transistor in accordance with the present invention.

With reference to FIG. 6, in another aspect the invention is a plurality of metal semiconductor field effect transistors (MESFETs) 66 formed on a low defect 3 inch (75 mm) silicon carbide wafer and having at least one continuous square inch (6.25 $cm^2$) of surface area with a basal plane dislocation density of between about 50 and 500 $cm^{-2}$. The substrate 68 includes a respective first surface 70 and second surface 72 opposite one another. A conductive channel 74 is located on the first surface 70 of the substrate 68. Ohmic source 76 and a drain 78 contacts are located on the conductive channel 74. A metal gate contact 80 is located between the source 76 and drain 78 on the conductive channel 74 for forming an active channel when a bias is applied to the metal gate contact 80.

As is known in the art, more than one type of device may be situated on a silicon carbide wafer in accordance with the present invention. Additional devices that may be included are junction-field effect transistors, hetero field effect transistors, diodes, and other devices known in the art. The structure and operation of these (and other) devices are well-understood in this art and can be practiced using the substrates described and claimed herein without undue experimentation.

In the specification and the drawings, typical embodiments of the invention have been disclosed. Specific terms have been used only in a generic and descriptive sense, and not for purposes of limitation. The scope of the invention is set forth in the following claims.

The invention claimed is:

1. A high quality single crystal wafer of SiC having a diameter of at least about 3 inches and at least one continuous square inch of surface area that has a basal plane dislocation density less than about 500 cm$^{-2}$.

2. A SiC wafer according to claim 1 wherein said at least one continuous square inch of surface area has a basal plane dislocation density that is less than about 100 cm$^{-2}$.

3. A SiC wafer according to claim 1 wherein said at least one continuous square inch of surface area has a basal plane dislocation density that is less than about 50 cm$^{-2}$.

4. A SiC wafer according to claim 1 wherein the crystal has a polytype selected from the group consisting of the 3C, 4H, 6H, 2H, and 15R polytypes.

5. A high quality semiconductor wafer comprising:
a silicon carbide wafer having a diameter of at least about 3 inches;
said wafer having the 4H polytype; and
said wafer having at least one continuous square inch of surface area that has a basal plane dislocation density on its surface of between about 50 and about 500 cm$^{-2}$.

6. A high quality semiconductor wafer comprising:
a silicon carbide wafer having a diameter of at least about 3 inches; and
said wafer having at least one continuous square inch of surface area having between about 2,000 and 20,000 basal plane dislocations.

7. A high quality semiconductor wafer comprising:
a silicon carbide wafer having a diameter of at least about 3 inches;
said wafer having at least one continuous square inch of surface area having a basal plane dislocation density of less than about 500 cm$^{-2}$; and
a Group III-nitride epitaxial layer on said surface of said silicon carbide wafer.

8. A semiconductor wafer according to claim 7 wherein said Group III-nitride layer is selected from the group consisting of GaN, AlGaN, AlN, AlInGaN, InN, AlInN and mixtures thereof.

9. A plurality of semiconductor device precursors comprising:
a silicon carbide wafer having a diameter of at least about 3 inches and having at least one continuous square inch of surface area with a basal plane dislocation density of less than about 500 cm$^{-2}$; and
a plurality of respective Group III-nitride epitaxial layers on some portions of said wafer.

10. A semiconductor wafer comprising:
a bulk single crystal silicon carbide substrate of at least about 3 inches and having at least one continuous square inch of surface area with a basal plane dislocation density of less than about 500 cm$^{-2}$, said bulk single crystal having respective first and second surfaces opposite one another; and
a plurality of devices on said silicon carbide substrate, each said device comprising:
an epitaxial layer located on the substrate, said layer having a concentration of suitable dopant atoms for making the epitaxial layer a first conductivity type, and respective source, channel, and drain portions;
a metal oxide layer on said channel portion; and
and a metal gate contact on said metal oxide layer for forming an active channel when a bias is applied to said metal gate contact.

11. A semiconductor wafer comprising:
a bulk single crystal silicon carbide substrate of at least about 3 inches and having at least one continuous square inch of surface area with a basal plane dislocation density of less than 500 cm$^{-2}$, said bulk single crystal having respective first and second surfaces opposite one another; and
a plurality of devices on said silicon carbide substrate, each said device comprising:
a conductive channel on said substrate;
a source and a drain on said conductive channel; and
a metal gate contact between said source and said drain on said conductive channel for forming an active channel when a bias is applied to the metal gate contact.

12. A semiconductor wafer comprising:
a bulk single crystal silicon carbide substrate of at least about 3 inches and having at least one continuous square inch of surface area with a basal plane dislocation density less than 500 cm$^{-2}$, said bulk single crystal having respective first and second surfaces opposite one another.

13. A semiconductor wafer according to claim 12 further comprising a plurality of junction field-effect transistors positioned on said first surface of said single crystal silicon carbide substrate.

14. A semiconductor wafer according to claim 12 further comprising a plurality of hetero-field effect transistors positioned on said first surface of said single crystal silicon carbide substrate.

15. A semiconductor wafer according to claim 12 further comprising a plurality of diodes positioned on said first surface of said single crystal silicon carbide substrate.

* * * * *